(12) United States Patent
Wang et al.

(10) Patent No.: US 10,401,694 B2
(45) Date of Patent: Sep. 3, 2019

(54) LIQUID CRYSTAL DISPLAY PANEL AND DISPLAY DEVICE

(71) Applicant: SHANGHAI TIANMA MICRO-ELECTRONICS CO., LTD., Shanghai (CN)

(72) Inventors: Lei Wang, Shanghai (CN); Mingwei Zhang, Shanghai (CN); Xiangjian Kong, Shanghai (CN); Jine Liu, Shanghai (CN); Feng Qin, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/950,532

(22) Filed: Apr. 11, 2018

(65) Prior Publication Data

US 2019/0227397 A1 Jul. 25, 2019

(30) Foreign Application Priority Data

Jan. 25, 2018 (CN) .......................... 2018 1 0071821

(51) Int. Cl.
  *G02F 1/1362* (2006.01)
  *G02F 1/1368* (2006.01)
  (Continued)

(52) U.S. Cl.
  CPC ...... *G02F 1/136213* (2013.01); *G02F 1/1368* (2013.01); *G02F 1/13439* (2013.01);
  (Continued)

(58) Field of Classification Search
  CPC ............. H01L 27/1225; H01L 29/7869; G02F 1/136213; G02F 1/133553; G02F 1/134309; G02F 1/13439; G02F 1/136209; G02F 1/136227; G02F 1/1368; G02F 1/133514; G02F 1/136286; G02F 2001/123; G02F 2202/10; G02F 2001/134372

See application file for complete search history.

(56) References Cited

U.S. PATENT DOCUMENTS

2012/0044449 A1* 2/2012 Hong ................ G02F 1/134309
349/144

FOREIGN PATENT DOCUMENTS

CN 103296030 A 9/2013

* cited by examiner

*Primary Examiner* — Nathanael R Briggs
(74) *Attorney, Agent, or Firm* — Anova Law Group, PLLC

(57) ABSTRACT

A liquid display panel, and a display device are provided. The liquid display panel includes an array substrate. The array substrate includes a base substrate, a plurality of data lines, a plurality of scanning lines, and an auxiliary electrode. The data lines and the scanning lines intersect to form a plurality of pixels arranged in an array. Each pixel includes a first sub-pixel and a second sub-pixel adjacent to each other. Each first sub-pixel includes a first pixel electrode and a first electrode, while each second sub-pixel includes a second pixel electrode. The second sub-pixel has an area larger than the first pixel; and the second pixel electrode has an area larger than the first pixel electrode. At least a portion of the auxiliary electrode and the first electrode overlap with each other to form a first auxiliary capacitance for the first sub-pixel, and an overlap region between the auxiliary electrode and the first electrode extends into the second sub-pixel of a same pixel.

20 Claims, 10 Drawing Sheets

(51) Int. Cl.
 *G02F 1/1343* (2006.01)
 *G02F 1/1335* (2006.01)
 *H01L 29/786* (2006.01)
 *H01L 27/12* (2006.01)

(52) U.S. Cl.
 CPC .. *G02F 1/133553* (2013.01); *G02F 1/134309* (2013.01); *G02F 1/136209* (2013.01); *G02F 1/136227* (2013.01); *G02F 1/133514* (2013.01); *G02F 1/136286* (2013.01); *G02F 2001/134345* (2013.01); *G02F 2201/123* (2013.01); *G02F 2202/10* (2013.01); *H01L 27/1225* (2013.01); *H01L 29/7869* (2013.01)

LIQUID CRYSTAL DISPLAY PANEL AND DISPLAY DEVICE

CROSS-REFERENCES TO RELATED APPLICATION

This application claims the priority of Chinese Patent Application No. 201810071821.2, filed on Jan. 25, 2018, the content of which is incorporated by reference in its entirety.

TECHNICAL FIELD

The present disclosure generally relates to the field of display technologies and, more particularly, relates to a low-power-consumption liquid crystal display panel and a display device thereof.

BACKGROUND

With continuous developments in sciences and technologies, display devices with display functions have been more and more widely used in applications. Among the display devices, a color display can provide more information and better visual experiences to users than a black/white display. A liquid crystal display device usually uses color filters to form color images, i.e., uses a space color mixing principle to mix three primary colors.

In a conventional liquid display device, liquid crystals are placed between an array substrate and a color film substrate, and two electrodes can generate an electrical field to drive electrical field effects of liquid crystal molecules. Correspondingly, a light source can be transmitted or blocked, and thus to display images. In comparison to a monochrome liquid crystal display device, a color liquid crystal display device further includes a color filter, i.e., a color-blocking layer. Every pixel usually includes three sub-pixels, corresponding to a red (R) color-blocking area, a Green (G) color-blocking area, and a Blue (B) color-blocking area in the color filter, respectively. A driving circuit provides red (R), green (G), and blue (B) signals of images, to drive corresponding pixels. Then a white light source can show different colors when the white light source passes through different color-blocking areas in the color filter, to display colorful images. Further, in a conventional red (R)-green (G)-blue(B) three-color liquid crystal display device, the driving circuit outputs different driving voltages to drive the liquid crystal display device to display different gray scales. Subsequently, different colors are displayed through different gray scales to accomplish a multi-color display. Four gray scale voltages are necessary for a 64-color display, which has a high power-consumption. Lowering frequencies may be used to reduce the power consumption, but pixel leakage effect may happen, inducing an anomaly in displaying brightness of middle gray scales and an anomaly in colors of the images.

The disclosed display panel, and display device and pressure sensing method thereof are directed to solve one or more problems set forth above and other problems.

SUMMARY

One aspect of the present disclosure provides a liquid display panel. The liquid display panel includes an array substrate. The array substrate includes a base substrate, a plurality of data lines, a plurality of scanning lines, and an auxiliary electrode. The data lines and the scanning lines intersect to form a plurality of pixels arranged in an array. Each pixel includes a first sub-pixel and a second sub-pixel adjacent to each other. Each first sub-pixel includes a first pixel electrode and a first electrode, while each second sub-pixel includes a second pixel electrode. The second sub-pixel has an area larger than the first pixel; and the second pixel electrode has an area larger than the first pixel electrode. At least a portion of the auxiliary electrode and the first electrode overlap with each other to form a first auxiliary capacitance for the first sub-pixel, and an overlap region between the auxiliary electrode and the first electrode extends into the second sub-pixel of a same pixel. Correspondingly, a storage capacitance of the first sub-pixel can be increased by a partial region of the second sub-pixel and the storage capacitance of the first sub-pixel is approximately equal to a storage capacitance of the second sub-pixel.

Another aspect of the present disclosure provides a display device. The display device includes a liquid crystal display panel provided by any embodiments of the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
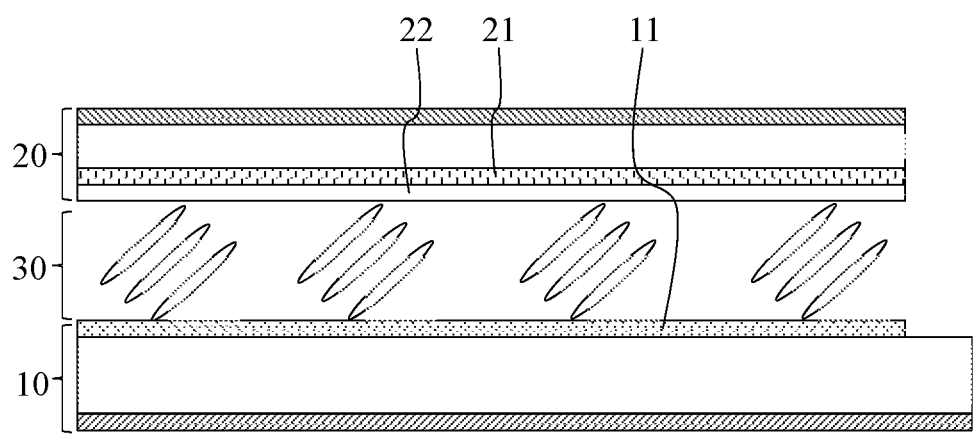
FIG. 1 illustrates an exemplary structure of a liquid display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined when there is no conflict. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the: cross-sectional views illustrating the device structures may not follow the common proportion and may be partially exaggerated. Besides, those schematic diagrams are merely examples, and not intended to limit the scope of the invention. Furthermore, a three-dimensional size including length, width and depth should be considered during practical fabrication.

First, the present disclosure provides a liquid crystal display panel. FIG. 1 illustrates an exemplary structure of a liquid display panel consistent with disclosed embodiments. For illustration purposes, the present embodiment is described using a reflective liquid crystal display panel as an example. Correspondingly, the liquid crystal display panel in FIG. 1 is a reflective liquid crystal display panel and may include an array substrate 10, a color film substrate 20, and a liquid crystal layer 30 between the array substrate 10 and the color film substrate 20. The liquid crystal layer 30 may be sealed in a box-shaped space formed by the array substrate 10 and the color film substrate 20.

Figure 2:
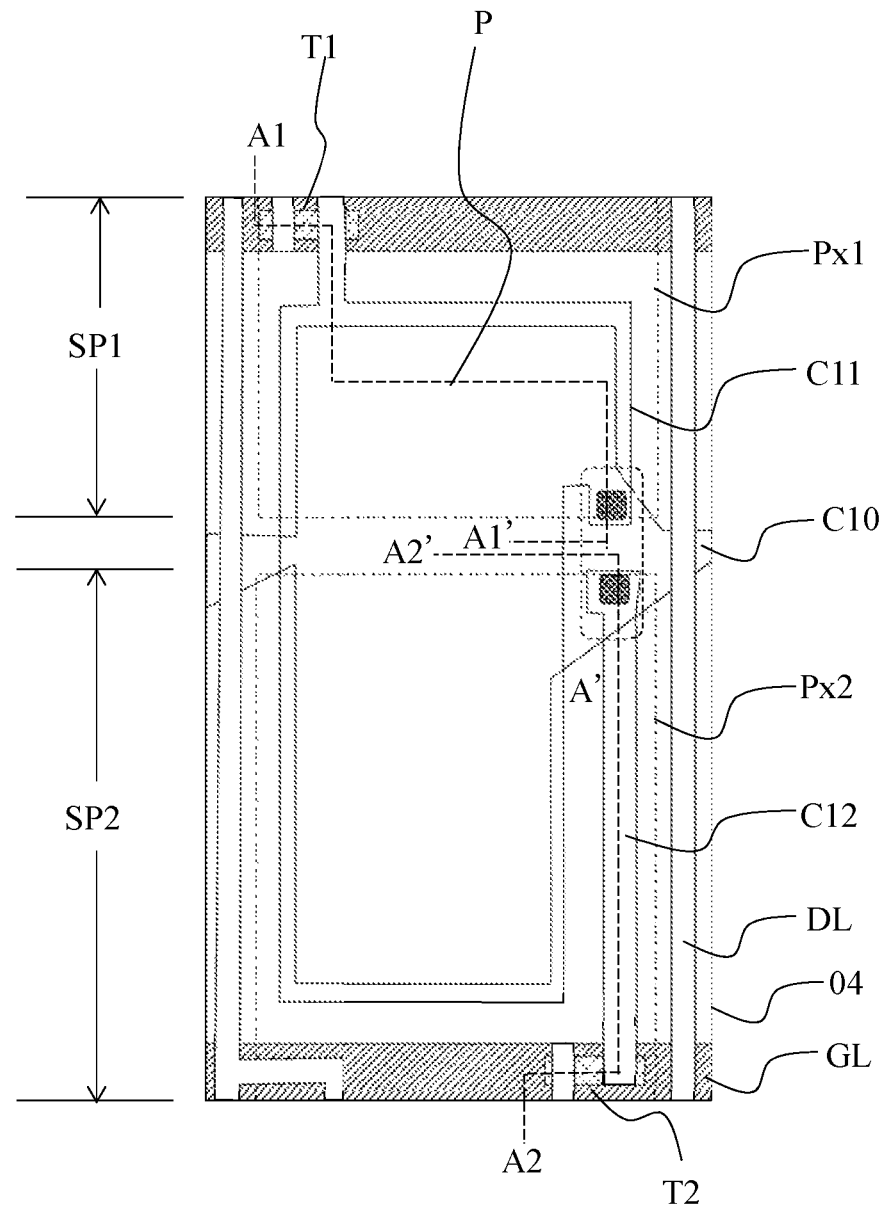
FIG. 2 illustrates an exemplary structure of a pixel in an array substrate consistent with disclosed embodiments.
Figure 3:
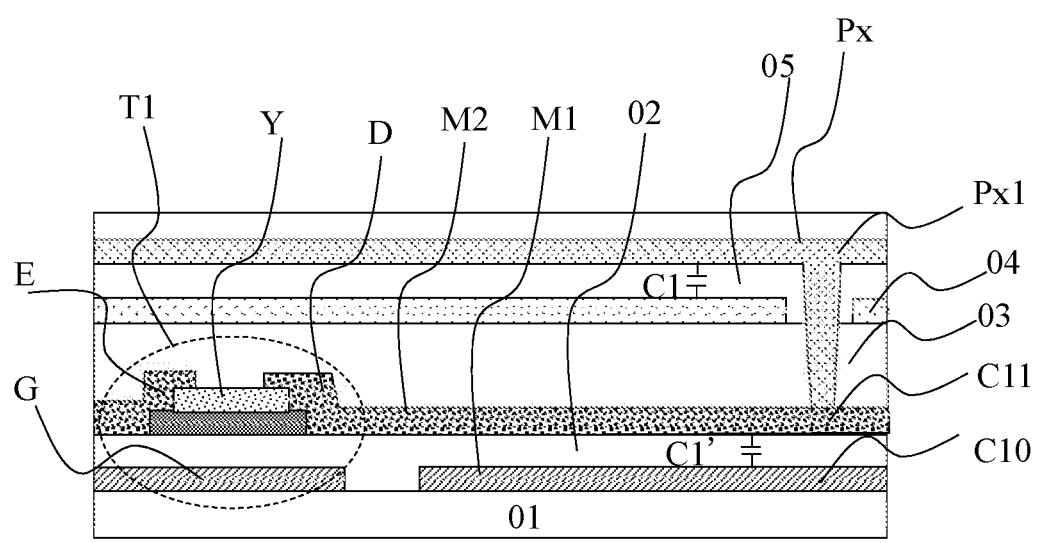
FIG. 3 illustrates a cross-section view along the A1-A1' direction in FIG. 2.
Figure 4:
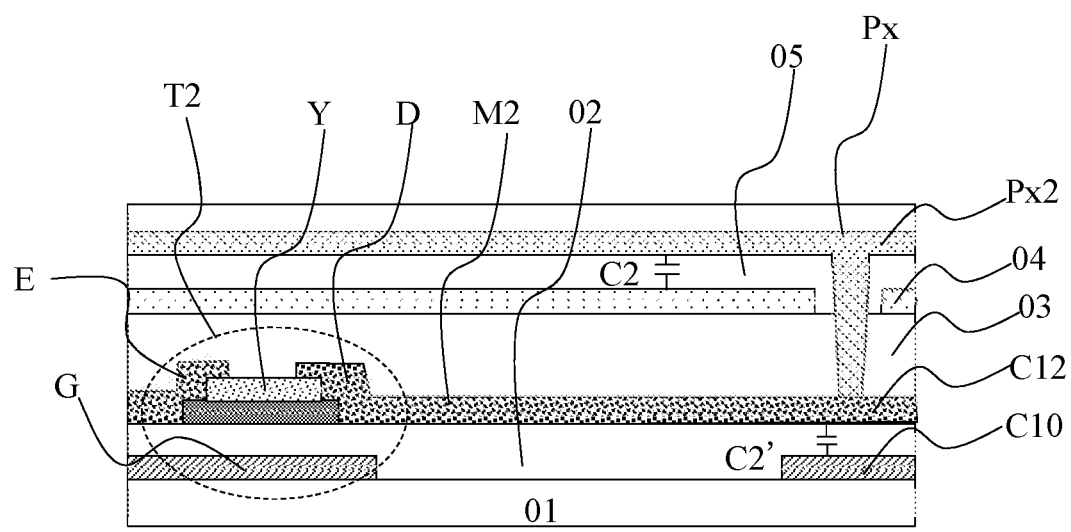
FIG. 4 illustrates a cross-section view along the A2-A2' direction in FIG. 2.

The array substrate 10 may have a structure illustrated in FIGS. 2-4. FIG. 2 illustrates an exemplary structure of a pixel in an array substrate consistent with disclosed embodiments. FIG. 3 illustrates a cross-section view along the A1-A1' direction in FIG. 2. FIG. 4 illustrates a cross-section view along the A2-A2' direction in FIG. 2.

The array substrate 10 may include: a base substrate 01, a plurality of data lines (DL) arranged in parallel on the base substrate 01, and a plurality of scanning lines (GL) arranged in parallel on the base substrate 01. The data lines and the scanning lines may intersect each other to form a plurality of pixels (P) arranged in an array, i.e., a pixel array on the base substrate 01. Each pixel P may include a first sub-pixel SP1 and a second sub-pixel SP2 adjacent to each other. In one embodiment, the first sub-pixel SP1 and the second sub-pixel SP2 may be arranged along an extending direction of the data lines.

Two pixel electrodes may be placed in each pixel and may be insulated to each other. A first pixel electrode Px1 and a second pixel electrode Px2 may be deployed in the first sub-pixel SP1 and in the second sub-pixel SP2 respectively. The second sub-pixel SP2 may have an area larger than the first sub-pixel SP1, or the second sub-pixel SP2 may have an opening larger than an opening of the first sub-pixel SP1. The second pixel electrode Px2 may also have an area larger than the first pixel electrode Px1. In one embodiment, the area of the second sub-pixel SP2 may be about twice of the area of the first sub-pixel SP1, i.e. the area of the opening in the second sub-pixel SP2 may be about twice of the area of the opening in the first sub-pixel SP1, and the area of the second pixel electrode Px2 may be about twice of the area of the first pixel electrode Px1. When the array substrate has a transmission structure, the opening may be a light-transmission region in the sub-pixels. When the array substrate has a reflective structure, the opening may be a reflective region in the sub-pixels. Or the opening may be a region to perform gray-scale displaying according to needs of displayed images.

In the present embodiment, the array substrate has a reflective structure and may further include a reflective metal layer 11 to reflect external incident natural lights to perform a gray-scale display.

In one embodiment, the first pixel electrode Px1 and the second pixel electrode Px2 may be used together as the reflective metal layer 11. The pixel electrodes may be formed by vapor depositing of reflective metal materials, such as aluminium and silver, or formed by compounds/alloys including aluminium or silver. The pixel electrode may have a reflective function and a conductive function simultaneously. An area where the first pixel electrode Px1 and the second pixel electrode Px2 are located may be used as a reflection area, and a gray scale display may be realized by reflecting externally incident natural lights. In areas not covered by the pixel electrodes (the first pixel electrode Px1 and the second pixel electrode Px2), in gaps between the two adjacent sub-pixels (the first sub-pixels SP1 and the second sub-pixels SP2), and in spaces between the adjacent pixels, the pixel electrode may be insulated, and may have gaps with a certain width. The gaps between the pixel electrodes may not reflect lights and may form constantly dark areas, to be used as light shielding areas between adjacent pixels or sub-pixels and prevent color mixing between adjacent pixels or sub-pixels. It can also be considered that areas covered by the first pixel electrode Px1 and the second pixel electrode Px2 form openings of the first sub-pixels SP1 and the second sub-pixels SP2 respectively. Only the areas covered by the first pixel electrode Px1 and the second pixel electrode Px2 can reflect lights and perform a gray scale display according to the needs of the displayed images.

In other embodiments, the reflective metal layer 11 may be formed additionally to provide the array substrate with reflective functions. For example, the pixel electrodes (the first pixel electrode Px1 and the second pixel electrode Px2) may be made of transparent metal-oxide materials, such as $InO_2$ and $SnO_2$. Then the reflective metal layer 11 may be deposited on the pixel electrode layer. The reflective metal layer 11 may be formed by vapor depositing of reflective metal materials such as aluminium and silver, or compounds/alloys including aluminium or silver. The reflective metal layer 11 may or may not be in contact with the pixel electrodes directly. Subsequently, the reflective metal layer 11 may include a plurality of reflective metal blocks each of which corresponds to one sub-pixel. Gaps with an appropriate width between adjacent metal blocks may serve as light shielding areas between adjacent pixels or sub-pixels and prevent color mixing between adjacent pixels or sub-pixels. An area covered by each reflective metal block may serve as a reflective area to perform a gray scale display by reflecting natural lights from outside and may form the opening for each sub-pixel.

In some embodiments, the reflective metal layer 11 may have a full-surface type when it is not in contact with the pixel electrode.

In one embodiment, the array substrate may further include a storage electrode 04. The pixel electrode layer Px and the storage electrode 04 may be disposed alternatively and insulated by a passivation layer 05 between the pixel electrode layer Px and the storage electrode 04. The storage electrode 04 may have overlapping portions with the first pixel electrode Px1 and the second pixel electrode Px2 in each pixel, respectively. The overlapping areas, and a portion of the passivation layer 05 between the pixel electrode layer Px and the storage electrode 04, may constitute capacitance elements. The storage electrode 04 may be made of metals, alloys, metal nitrides, metal oxides, metal nitrogen oxides, stacking layers by metal materials and other conducting materials, or may be formed by an additional transparent conducting layer. In a driving process, the storage electrode 04 may have a common voltage by being connected to a common electrode through a common signal line. In other embodiments, the storage electrode 04 may have a full-surface type. Each first pixel electrode Px1 may overlap with a portion of the storage electrode 04 to form a first capacitance C1, and each second pixel electrode Px2 may overlap with a portion of the storage electrode 04 to form a second capacitance C2.

In certain embodiments, the second sub-pixel SP2 may have an area larger than the first sub-pixel SP1, and the second pixel electrode Px2 may have an area larger than the first pixel electrode Px1. The passivation layer 05 between the pixel electrode layer Px and the storage electrode 04 may have a constant thickness. Correspondingly, a difference between the first capacitance C1 and the second capacitance C2 may be large, inducing a low capacitance retention rate in a low-frequency driving process and a flickering problem in a liquid crystal displaying panel formed by the array substrate. To alleviate such problem, a first auxiliary capacitance C1' may be introduced. Referring to FIGS. 1-3, the array substrate may further include a first auxiliary electrode C10 and a first electrode C11. The first electrode C11 may overlap with a portion of the auxiliary electrode C10 to form the first auxiliary capacitance C1', and an overlapping area between the first electrode C11 and the auxiliary electrode C10 may extend from the first sub-pixel SP1 to the adjacent second sub-pixel SP2. Since the area of the first sub-pixel SP1 is smaller than the area of the second sub-pixel SP2, the first capacitance C1 may be smaller than the second capacitance C2. In the present embodiment, the first auxiliary capacitance C1' may be added to the first sub-pixel SP1, and the area of the first auxiliary capacitance C1's may be increased by occupying a partial area of the adjacent second sub-pixel SP2. Correspondingly, the capacitance value of the first auxiliary capacitance C1' may be increased.

The first pixel electrode Px1 and the storage electrode 04 may overlap with each other to form a first overlapping region, and an area of the first overlapping region can be denoted as S11. The second pixel electrode Px2 and the storage electrode 04 may overlap with each other to form a second overlapping region, and an area of the second overlapping region can be denoted as S21. The first electrode C11 and the auxiliary electrode C10 may overlap with each other to form a third overlapping region, and an area of the third overlapping region can be denoted as S12. S21 may be approximately equal to a sum of S11 and S12. Correspondingly, the storage capacitance of the first sub-pixel SP1 may include the first capacitance C1 and the first auxiliary capacitance C1', while the storage capacitance of the second sub-pixel SP2 may include the second capacitance C2. The first auxiliary capacitance C1' may compensate the large capacitance difference between two adjacent sub-pixels, and make the storage capacitance of the first sub-pixel SP1 approximately equal to the storage capacitance of the second sub-pixel SP2. Correspondingly, when low-frequency leakage occurs, the two sub-pixels may have same leakage performance and the corresponding common voltage may be also consistent. Then displaying problems, such as flickering and afterimage, may be alleviated, and the display effect may be improved.

The array substrate may have various different layered structures. In one embodiment, the layered structure of the array substrate may include: a first metal layer M1 on a base substrate 01, a second metal layer M2, and a planarizing layer 03 covering the first metal layer M1 and the second metal layer M2. The first metal layer M1 and the second metal layer M2 may be insulated by a gate-insulating layer 02 between the first metal layer M1 and the second metal layer M2. The storage electrode 04 may be deployed on one side of the planarizing layer 03 away from the first metal layer M1 and the second metal layer M2. The pixel electrode layer Px may be deployed on one side of the storage electrode 04 away from the planarizing layer 03, and the pixel electrode layer Px and the storage electrode 04 may be insulated to each other by the passivation layer 05 between the pixel electrode layer Px and the storage electrode 04. The pixel electrode layer Px include the first pixel electrode Px1 and the second pixel electrode Px2.

The array substrate may further include a plurality of thin film transistors. The thin film transistors may include a first thin film transistor T1 and a second thin film transistor T2, which may be deployed in the first sub-pixel SP1 and in the second sub-pixel SP2 respectively, for each pixel. The first metal layer M1 may include gates G for the thin film transistors (including the first thin film transistor T1 and the second thin film transistor T2), the scanning lines GL and the auxiliary electrode C10. The second metal layer M2 may include the data lines DL, the first electrode C11, sources E and drains D of the thin film transistors (including the first thin film transistor T1 and the second thin film transistor T2).

Referring to FIG. 2, the first electrode C11 may be connected to the drain D of the first thin film transistor T1 directly and the first pixel electrode Px1 may be connected to the drain D of the first thin film transistor T1 through the first electrode C11. FIG. 3 is a cross-section view of a portion of the array substrate for the first sub-pixel SP1. The first pixel electrode Px1 may be connected to the drain D of the first thin film transistor T1 through a penetrating hole crossing the planarizing layer 03. Correspondingly, the first electrode C11 and the first pixel electrode Px1 may have the same data voltage. A common voltage signal may be transferred to the storage electrode 04 and the auxiliary electrode C10, and then the storage electrode 04 and the auxiliary electrode C10 may have a common voltage Correspondingly, the first capacitance C1 may be formed between the first pixel electrode Px1 and the storage electrode 04, and the first auxiliary capacitance C1' may be formed between the first electrode C11 and the auxiliary electrode C10. The first auxiliary electrode C1' may extend from the region of the first sub-pixels to the region of the second sub-pixel SP2, and may occupy a portion of the area of the second sub-pixel SP2 to increase the storage capacitance of the first sub-pixel SP1. Correspondingly, the storage capacitance of the first sub-pixel SP1 may approximately equal to the storage capacitance of the second sub-pixel SP2.

Referring to FIG. 2 and FIG. 4, the second sub-pixel SP2 may further include a second electrode C12. The second pixel electrode Px2 may be connected to the drain D of the second thin film transistor T2 by the second electrode C12. The second electrode C12 may be formed with the first electrode C11. The second electrode C12 and the auxiliary electrode C10 may overlap with each other to form a fourth overlapping region and a second auxiliary capacitance C2'. Since the fourth overlapping region between the first electrode C11 and the auxiliary electrode C10 may extend into the second sub-pixel SP2 and may occupy a portion of the second sub-pixel SP2, the fourth overlapping region between the second electrode C12 and the auxiliary electrode C10 may be located on a portion of the remaining area of the second sub-pixel SP2. An area of the fourth overlapping region between the second electrode C12 and the auxiliary electrode C10 can be denoted as S22, and a sum of S21 and S22 may be approximately equal to a sum of S11 and S12. Correspondingly, the storage capacitance of the first sub-pixel SP1 may include the first capacitance C1 and the first auxiliary capacitance C1', while the storage capacitance of the second sub-pixel SP2 may include the second capacitance C2 and the second auxiliary capacitance C2'. The storage capacitance of the first sub-pixel SP1 may be approximately equal to the storage capacitance of the second sub-pixel SP2. The storage capacity of the second sub-pixel SP2 the may be increased when making the storage capacitance of the first sub-pixel SP1 approximately equal to the storage capacitance of the second sub-pixel SP2.

In other embodiments, the pixel electrode layer Px (including the first pixel electrode Px1 and the second pixel electrode Px2) and the storage electrode may be transparent conducting layers, and the second metal layer M2 may be used as the reflective metal layer simultaneously.

Figure 5:
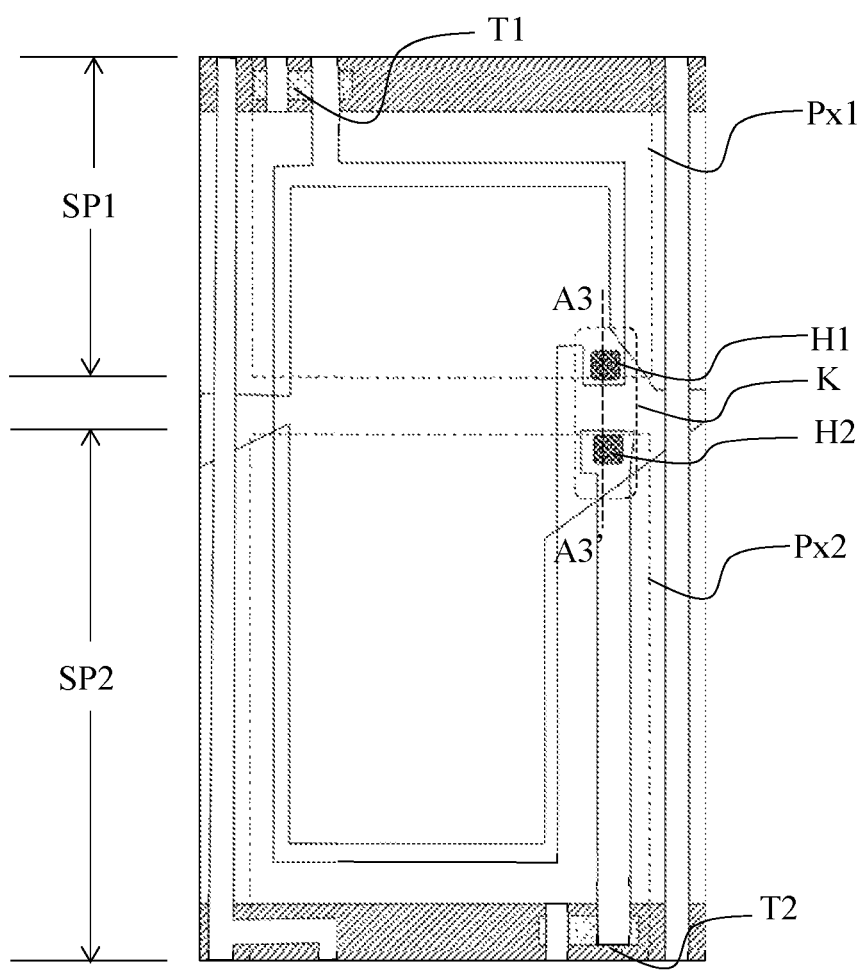
FIG. 5 illustrates another exemplary structure of a pixel in an array substrate consistent with disclosed embodiments.
Figure 6:
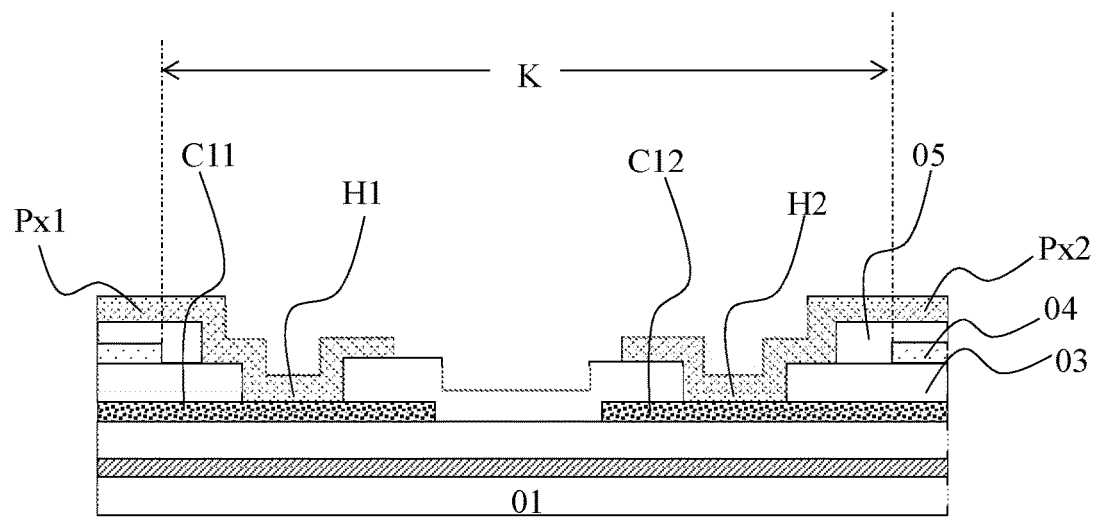
FIG. 6 illustrates a cross-section view along the A3-A3' direction in FIG. 5.

FIG. 5 and FIG. 6 illustrates connections between the pixel electrodes and the drains in a pixel of the array substrate. FIG. 5 illustrates another exemplary structure of a pixel in an array substrate consistent with disclosed embodiments. FIG. 6 illustrates a cross-section view along the A3-A3' direction in FIG. 5.

In the present embodiment, the thin film transistors may at least include a first thin film transistor T1 and a second thin film transistor T2, which may be deployed in the first sub-pixel SP1 and in the second sub-pixel SP2 respectively, for each pixel. The first pixel electrode Px1 may be connected to the drain D of the first thin film transistor T1 through the first electrode C11, and the second pixel electrode Px2 may be connected to the drain D of the second thin film transistor T2 through the second electrode C12. The first pixel electrode Px1 may be connected to the first electrode C11 by a first penetrating hole H1 through the planarizing layer 03, and the second pixel electrode Px2 may be connected to the second electrode C12 by a second penetrating hole H2 through the planarizing layer 03.

The first penetrating hole H1 and the second penetrating hole H2 may be deployed alternatively in a border between the first sub-pixel SP1 and the second sub-pixel SP2. Since both the first penetrating hole H1 and the second penetrating hole H2 may cross the storage electrode 04, and both the first pixel electrode Px1 and the second pixel electrode Px2 cannot contact the storage electrode 04, an opening K may be formed in the storage electrode 04 and the passivation layer 05 to make the first penetrating hole H1 and the second penetrating hole H2 passing through the opening K. The opening K may have a diameter larger than the diameter of the first penetrating hole H1 and the second penetrating hole H2. Correspondingly, the first penetrating hole H1 and the second penetrating hole H2 may be deployed alternatively in a border between the first sub-pixel SP1 and the second sub-pixel SP2, to make the first penetrating hole H1 and the second penetrating hole H2 located in the same opening K of the storage electrode 04 and the passivation layer 05. Subsequently, the opening precision may be controlled easily and the good-production rate may be achieved.

Figure 7:
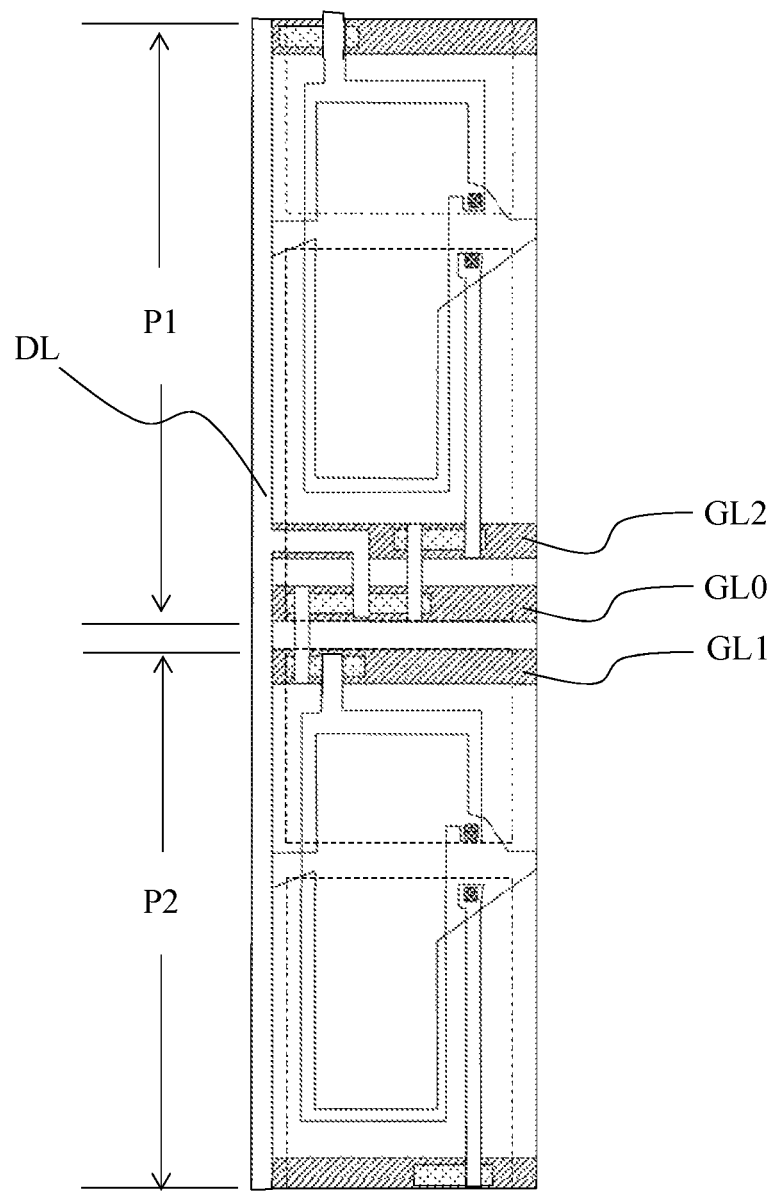
FIG. 7 illustrates another exemplary structure of a pixel in an array substrate consistent with disclosed embodiments.
Figure 8:
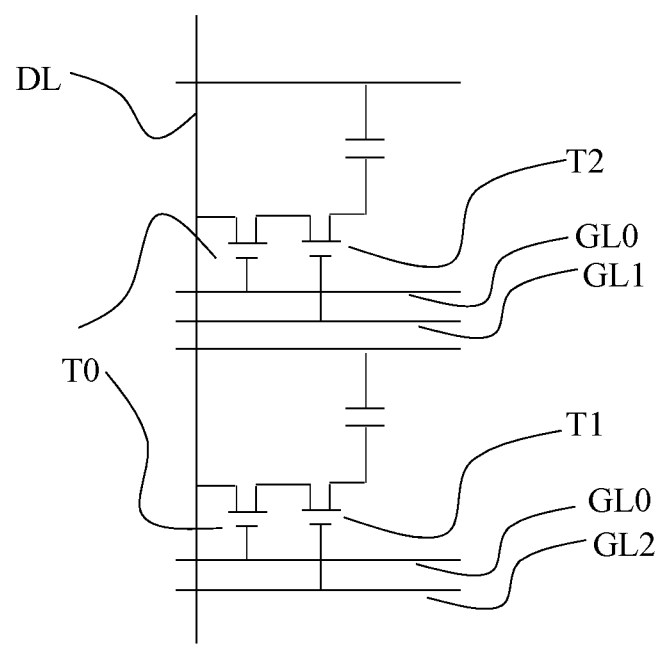
FIG. 8 illustrates a pixel driving circuit in an array substrate in FIG. 7.

FIG. 7 and FIG. 8 illustrates a driving connection of the pixel array in the array substrate. FIG. 7 illustrates an exemplary structure of a pixel in another array substrate consistent with disclosed embodiments. FIG. 8 illustrates a pixel driving circuit in an array substrate in FIG. 7.

In one embodiment, pixels arranged in an array may include first pixels P1 and second pixels P2 adjacent to each other. The first pixels P1 and the second pixels P2 may be arranged along an extending direction of the data lines, while the first sub-pixel and the second pixel of each pixel are arranged along the extending direction of the data lines. The second sub-pixel SP2 of one first pixel P1 may be adjacent to the first sub-pixel SP1 of the adjacent second pixel P2, and may be located between two adjacent data lines DL. Each scanning line GL may include a second scanning line GL2, a primary scanning line GL0 and a first scanning line GL1, sequentially between the first pixel P1 and the second pixel P2.

The array substrate may further include a primary thin film transistor T0, a first thin film transistor T1, and a second thin film transistor T2, for one pixel. A gate of the primary thin film transistor T0 may be connected to the primary scanning line GL0, and a source of the primary thin film transistor T0 may be connected to the data line DL, which is also connected to the second sub-pixel SP2 of the corresponding first pixel P1. The primary thin film transistor may include a first drain and a second drain. The first drain of the primary thin film transistor T0 may be connected to the source of the first thin film transistor T1, and the second drain of the primary thin film transistor T0 may be connected to the source of the second thin film transistor T2.

The gate of the first thin film transistor T1 may be connected to the first scanning line GL1, and the source of the first thin film transistor T1 may be connected to the first drain of the primary thin film transistor T0. The drain of the first thin film transistor T1 may be connected to the first pixel electrode Px1 corresponding to the first sub-pixel SP1 of the second pixel P2. The gate of the second thin film transistor T2 may be connected to the second scanning line GL2, and the source of the second thin film transistor T2 may be connected to the second drain of the primary thin film transistor T0. The drain of the second thin film transistor T2 may be connected to the second pixel electrode Px2 corresponding to the second sub-pixel Px2 of the first pixel P1.

In one embodiment, the array substrate may drive the first sub-pixel SP1 through the primary thin film transistor T0 and the first thin film transistor T1, and may drive the second sub-pixel SP2 through the primary thin film transistor T0 and the second thin film transistor T2. The adjacent first sub-pixel SP1 and second sub-pixel SP2 may share the primary thin film transistor T0.

The source and the drain of the primary thin film transistor T0 may be formed at the same layer as the sources and drains of the first thin film transistor T1, and the sources and drains of the second thin film transistor T2. The gate of the primary thin film transistor T0 may be formed at the same layer as the gates of the first thin film transistor T1 and the gates of the second thin film transistor T2.

The primary thin film transistor T0, the first thin film transistor T1 and the second thin film transistor T2 may be a metal-oxide thin film transistor, such as an indium-gallium-zinc oxide (IGZO) thin film transistor.

Each metal-oxide thin film transistor may include a gate G formed in the base substrate 01, a gate insulating layer 02 on the gate G, an oxide source layer Y on the gate insulating layer 02, source S and drain D electrically connected to two ends of the oxide source layer Y respectively. The metal-oxide thin film transistor may also include a contacting layer between the source/drain and the oxide source layer, and the source/drain may be connected to the oxide source layer through the contacting layer. The contacting layer may be made of a material which has compositions same as a material of the oxide source layer, but the materials of the contacting layer and the oxide source layer may have different oxygen concentrations to make the contacting layer being conductive. The oxide source layer may be made of indium gallium zinc oxide (IGZO), and the gate insulating layer may be made of $SiO_2$. The metal oxide transistor has a large on-state current and a small off-state current. Correspondingly, the charge rate of the pixels in the liquid crystal display panel and the retention rate in a low-frequency driving process may be further improved, and the display effect can be enhanced further.

In one embodiment, the color film substrate 20 may include a color filter layer 21 on the upper base substrate and a common electrode 22. The common electrode 22 may be deployed on one side of the color filter layer 21 away from the upper base substrate, and may cover the color filter layer 21. The color filter layer 21 may include a plurality of color-blockers for different colors, corresponding to different pixels respectively. The second sub-pixel SP2 and the first sub-pixel SP1 in one pixel P may correspond to color-blockers for the same color.

Figure 9:
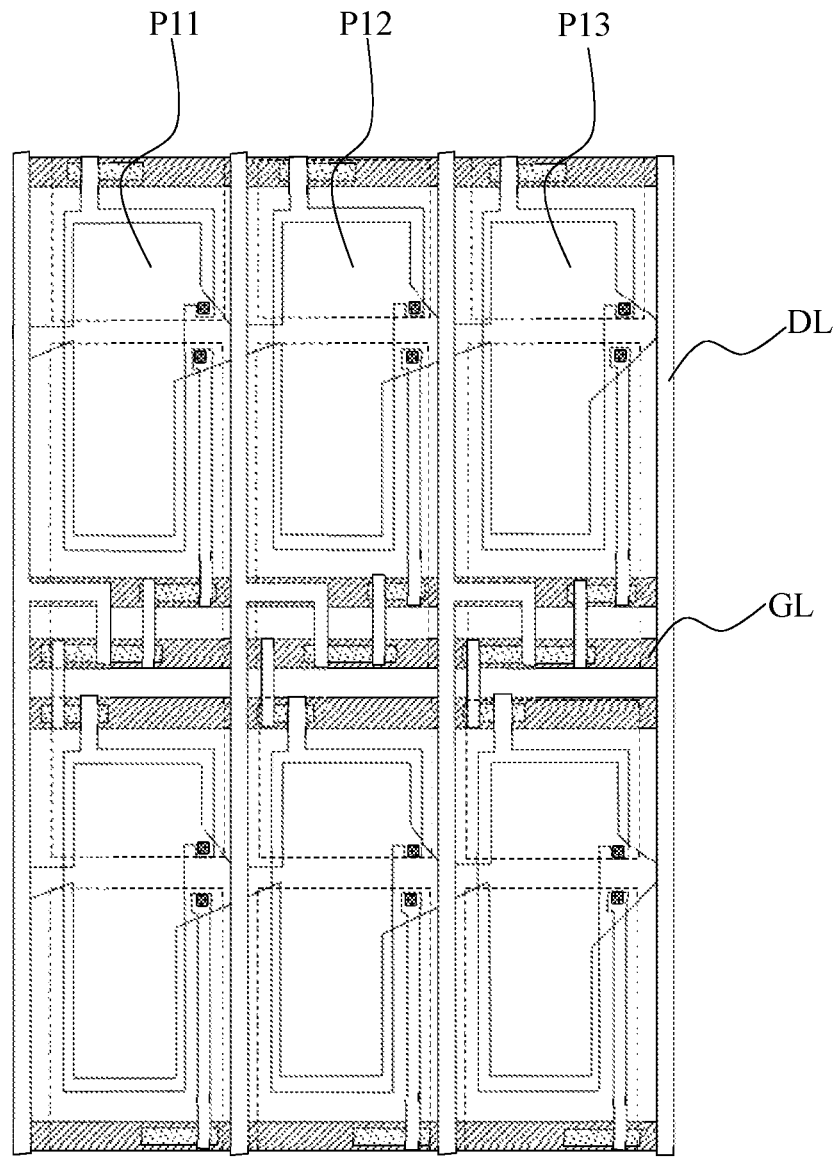
FIG. 9 illustrates another exemplary structure of a pixel in an array substrate consistent with disclosed embodiments.
Figure 10:
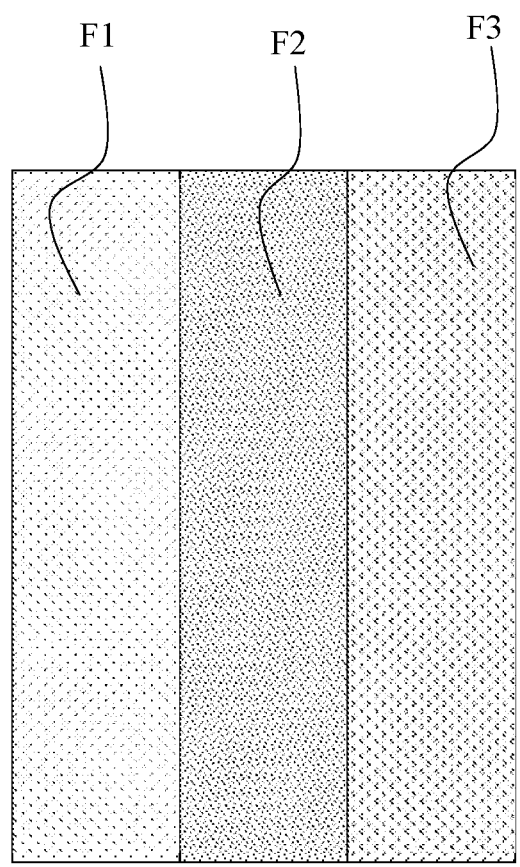
FIG. 10 illustrates a structure of a color filter layer consistent with disclosed embodiments.

FIG. 9 and FIG. 10 illustrate a configuration of the pixel array and the color filter layer. FIG. 9 illustrates another exemplary structure of a pixel in an array substrate consistent with disclosed embodiments. FIG. 10 illustrates a structure of a color filter layer consistent with disclosed embodiments. The pixels arranged in an array may at least include a first color pixel P11, a second color pixel P12, and a third color pixel P13. The first color pixel P11, the second color pixel P12, and the third color pixel P13 may be arranged along the extending direction of the scanning lines GL. The color filter layer 21 may include a first color-blocker F1, a second color-blocker F2 and a third color-blocker F3, which corresponds to the first color pixel P11, the second color pixel P12, and the third color pixel P13, respectively.

A color of the first color-blocker F1, the second color-blocker F2 and the third color-blocker F3 may be different from each other, and may be configured according to the needs of the display. For example, the color of the first color-blocker F1, the second color-blocker F2 and the third color-blocker F3 may be configured as one of three primary colors respectively, such as red, green and blue.

Each of the first color pixel P11, the second color pixel P12, and the third color pixel P13 may include the first sub-pixel and the second sub-pixel described above. The first sub-pixels and the second sub-pixels may be arranged along the extending direction of the data line DL. A plurality of the first color pixels P11 may be arranged along the extending direction of the data lines DL repeatedly. A plurality of the second color pixels P12 may be arranged along the extending direction of the data lines DL repeatedly. A plurality of the third color pixels P13 may be arranged along the extending direction of the data lines DL repeatedly.

In one embodiment, the first sub-pixel and the second sub-pixel may correspond to color-blockers for same colors. A plurality of the second color pixels P12 may be arranged along the extending direction of the data lines DL repeatedly. A plurality of the third color pixels P13 may be arranged along the extending direction of the data line DL repeatedly. Correspondingly, the color filter layer may include a plurality of rows of color-blockers. Each row of the color-blockers may correspond to a plurality of first color pixels P11 in the same row, or each row of the color-blockers may correspond to a plurality of second color pixels P12 in the same row, or each row of the color-blockers may correspond to a plurality of third color pixels P13 in the same row. Especially, in a reflective liquid crystal display panel, when the pixel electrodes corresponding to each sub-pixel are used as the reflective metal layer simultaneously or the reflective metal layer is not a full-surface structure, the reflective metal layer between the adjacent sub-pixels may have gaps with a certain width. The gaps of the reflective metal layer between the adjacent sub-pixels may be used as the constantly dark areas to prevent color mixing between the adjacent sub-pixels. Correspondingly, black matrixes may be not needed in positions corresponding to the areas between the different color-blockers in the color filter layer. Each row of the color-blockers corresponding to each row of pixels may be an entire color-blocker area of the same color. The adjacent color-blockers may be in contact with each other.

In other embodiments, the black matrix may be used to separate the color-blockers of different colors. Then the liquid crystal display panel may further include the black matrix for light shielding. The black matrix may be deployed on the color film substrate or on the array substrate. The black matrix may be arranged in an array, and may separate the different sub-pixels in one pixel or in the adjacent pixels, to prevent the color mixing.

Signals from the second scanning line and the primary scanning line may drive the second pixel electrode Px2 in the second sub-pixel SP2 of the first pixel P1 through the primary thin film transistor T0 and the second thin film transistor T2. Signals from the first scanning line and the primary scanning line may drive the first pixel electrode Px1 in the first sub-pixel SP1 of the second pixel P2 through the primary thin film transistor T0 and the first thin film transistor T2. A voltage difference may be formed between the pixel electrodes and the common electrode based on signals from the data lines, and may drive liquid crystal molecules in the liquid crystal layer to change states. In this state, external lights incident from one side of the color filter layer may reach the reflective metal layer on the array substrate through the liquid crystal layer, and then may be reflected into the liquid crystal layer. Correspondingly, the lights may display images according to orientation angles of the liquid crystal molecules.

In the area of each sub-pixel in one pixel, the liquid crystal molecules may change the states, such as rotate and/or distortion, driven by the voltage difference may be formed between the pixel electrodes and the common electrode based on signals from the data line. This effect plus the polarization device on the base substrate may cause that the area of each sub-pixel may have two states including an on state and an off state. When the sub-pixel is in the off state, the lights reflected by the reflective metal layer cannot pass the area corresponding to this sub-pixel, and the area corresponding to this sub-pixel may display black; when the sub-pixel is in the on state, the lights reflected by the reflective metal layer can pass the area corresponding to this sub-pixel, and the area corresponding to this sub-pixel may display a color of the corresponding color-blocker. Each pixel may display black or other colors according to the images, by controlling data signals in the data line connected to the pixel electrodes in sub-pixels.

In one embodiment, the first sub-pixel and the second sub-pixel in one pixel may be in the off state simultaneously, by controlling the voltage difference between the pixel electrodes and the common electrodes. Then the regions of the first sub-pixel and the second sub-pixel may display black simultaneously, and the corresponding pixel may display black. The first sub-pixel and the second sub-pixel in one pixel may be in the on state simultaneously, by controlling the voltage difference between the pixel electrodes and the common electrodes. Then the lights reflected by the reflective metal layer can pass the regions corresponding to the first sub-pixel and the second sub-pixel, and the regions of the first sub-pixel and the second sub-pixel may display a color of the corresponding color-blocker, i.e., the color corresponding to the color-blocker of the pixel where the first sub-pixel and the second sub-pixel is located. In one pixel, the first sub-pixel may be in the on state and the second sub-pixel may be in the off state, by controlling the voltage difference between the pixel electrodes and the common electrodes. Then the regions of the first sub-pixel may display a color of the corresponding color-blocker, and the regions of the second sub-pixel may display black. In one pixel, the first sub-pixel may be in the off state and the second sub-pixel may be in the on state, by controlling the voltage difference between the pixel electrodes and the common electrodes. Then the region of the second sub-pixel may display a color of the corresponding color-blocker, and the regions of the first sub-pixel may display black.

In the last three states above, although the color of the color-blocker corresponding to the first sub-pixel and the second sub-pixel is same, the amount of the light passing through the color-blocker corresponding to the first sub-pixel may be different from the amount of the light passing through the color-blocker corresponding to the second sub-pixel, because the areas of the first sub-pixel and the second sub-pixel are different. Correspondingly, the light passing through the color-blocker corresponding to the first sub-pixel and the second sub-pixel may have a different brightness, and then the human eyes may sense different colors.

Thus, although the color of the color-blocker corresponding to the first sub-pixel and the color of the second sub-pixel is same, the pixel where the first sub-pixel and the second sub-pixel is located may display different colors in the last three states. The amount of the light passing through the color-blocker corresponding to the pixel may be largest when both the first sub-pixel and the second sub-pixel in the pixel are in the on state, and the amount of the light passing through the color-blocker corresponding to the pixel may be smallest when the first sub-pixel is in the on state and the second sub-pixel is in the off state. The pixel may display a color of F10 when the first sub-pixel and the second sub-pixel in the pixel is in the on state simultaneously, and may display a color of F11 when the first sub-pixel is in the on state and the second sub-pixel in the pixel is in the off state. The pixel may display a color of F12 when the first sub-pixel is in the off state and the second sub-pixel in the pixel is in the on state. F10, in fact, is a superposition color of F11 and F12. Correspondingly, each pixel may display four different colors including black, F10, F11, and F12, in a different time.

Moreover, the pixel array of the array substrate may at least include a first color pixel, a second color pixel, and a third color pixel. When the first color pixel, the second color pixel, and the third color pixel correspond to different color-blockers, the first color pixel can display four different colors, the second color pixel can display four different colors, and the third color pixel can display four different colors. The four colors displayed by the first color pixel may be different from the four colors displayed by the second color pixel; the four colors displayed by the second color pixel may be different from the four colors displayed by the third color pixel; and the four colors displayed by the third color pixel may be different from the four colors displayed by the first color pixel. Correspondingly, in the liquid crystal display panel formed by the array substrate including the pixel array, 4*4*4=64 colors could be displayed by providing driving voltages corresponding the on and off states to the pixel electrodes. A plurality of gray scale voltages in the liquid crystal display panel may be avoided. Correspondingly, the power consumption may be lowered, and the design cost and production cost of the driving parts may be reduced.

In a conventional color liquid crystal display panel, a driving integrated circuit is used to setup different driving voltages to drive the liquid crystal to display different gray scale. In a red (R), green (G), and blue (B) liquid crystal display panel, at least four gray scale voltages are needed to perform 64-color display. If lowering the frequency is used to reduce the driving power consumption, a serious leakage may happen in the pixel, and the brightness of the middle gray scales may be abnormal which causes the abnormal color of the displayed images. In the present disclosure, the liquid crystal display panel uses a method of dividing the driving region in the pixel, and only a high voltage and a low voltage may be used to control each sub-pixel to be in a bright state or in a dark state, to achieve a multi-color display. The power consumption of the driving circuit in the liquid crystal display panel may be reduced, and a multi-color display with ultra-low power consumption may be achieved. The two sub-pixels in the liquid crystal display panel provided by the present disclosure may have approximately same storage capacitance, and then the storage capacitance may be as same as the liquid crystal capacitance. Correspondingly, when low-frequency leakage happens, the two sub-pixels may have same leakage and same common voltage. Then the flickering and afterimage problems may be avoided, and the display effects may be improved. Moreover, in the liquid crystal display panel provided by the present disclosure, the voltage corresponding to the brightest state and the darkest state may have a very small effect on the brightness, and the change in the brightness may be not sensitive to the change in the voltage. Correspondingly, even if the leakage happens, the change in the brightness may be small, and a driving with even lower frequency may be achieved, to further reduce the driving power-consumption.

In the above description, the reflective liquid crystal display panel was only used as an example to describe the method of dividing driving regions in the pixels provided by the present disclosure, and should not limit the scope of the present disclosure. For example, the liquid crystal display panel may be a half-reflective half-transmission liquid crystal display panel.

The liquid crystal layer may have one of ECB, TN, VA and/or other modes. In one embodiment, the liquid crystal layer may have a TN-NW mode.

The present disclosure may also provide a display device including the liquid crystal display panel provided by various embodiments of the present disclosure described above.

The embodiments disclosed herein are exemplary only. Other applications, advantages, alternations, modifications, or equivalents to the disclosed embodiments are obvious to those skilled in the art and are intended to be encompassed within the scope of the present disclosure. Therefore, although the present disclosure has been described in detail through the above embodiments, the present disclosure is not limited to the above embodiments, and other equivalent embodiments which do not depart from concepts of the present disclosure should be included. The scope of the present disclosure is determined by the scope of the claims.

What is claimed is:
1. A liquid crystal display panel, comprising:
an array substrate, the array substrate including:
a base substrate;
a plurality of data lines and a plurality of scanning lines;
an auxiliary electrode; and
a storage electrode, wherein:
the plurality of data lines and the plurality of scanning lines intersect to form a plurality of pixels arranged in an array;
each of the plurality of pixels includes a first sub-pixel and a second sub-pixel adjacent to each other;
the first sub-pixel includes a first pixel electrode and a first electrode;
the second sub-pixel includes a second pixel electrode;
the second sub-pixel has an area larger than the first sub-pixel;
the second pixel electrode has an area larger than the first pixel electrode;
at least a portion of the auxiliary electrode and the first electrode overlaps with each other to form a first auxiliary capacitance for the first sub-pixel;
an overlap region between the auxiliary electrode and the first electrode extends into the second sub-pixel of a same pixel; and
the storage electrode, the first electrode and the auxiliary electrode are sequentially disposed along a direction perpendicular to the base substrate.

2. The liquid crystal display panel according to claim 1, wherein:
at least a portion of the storage electrode overlaps with the first pixel electrode to form a first overlapping region, wherein an area of the first overlapping region is denoted as S11;
at least a portion of the storage electrode overlaps with the second pixel electrode to form a second overlapping region, wherein an area of the second overlapping region is denoted as S21;
at least a portion of the storage electrode overlaps with the first electrode to form a third overlapping region, wherein an area of the third overlapping region is denoted as S12; and
S21 is approximately equal to a sum of S11 and S12.

3. The liquid crystal display panel according to claim 2, wherein:
at least a portion of the storage electrode overlaps with the first pixel electrode to form a first capacitance;
at least a portion of the storage electrode overlaps with the second pixel electrode to form a second capacitance;
a storage capacitance of the first sub-pixel includes the first capacitance and the first auxiliary capacitance; and
a storage capacitance of the second sub-pixel includes the second capacitance and is approximately equal to the storage capacitance of the first-sub-pixel.

4. The liquid crystal display panel according to claim 2, wherein
the first sub-pixel further includes a first thin film transistor; and
the first pixel electrode is connected to a drain of the first thin film transistor through the first electrode.

5. The liquid crystal display panel according to claim 1, wherein the array substrate further includes:
a first metal layer on the base substrate, the first metal layer including the auxiliary electrode and the scanning lines;
a second metal layer on one side of the first metal layer away from the base substrate, the second metal layer including the first electrode, the data lines, and the drain of a first thin film transistor; and
a gate insulating layer between the first metal layer and the second metal layer.

6. The liquid crystal display panel according to claim 5, wherein:
the second sub-pixel includes a second electrode and a second thin film transistor:
the second pixel electrode is connected to a drain of the second thin film transistor through the second electrode; and
a portion of the auxiliary electrode overlaps with the second electrode to form a second auxiliary capacitance, wherein an overlapping area between the auxiliary electrode and the first electrode is larger than an overlapping area between the auxiliary electrode and the second electrode.

7. The liquid crystal display panel according to claim 6, wherein:
at least a portion of the storage electrode overlaps with the first pixel electrode to form a first overlapping region, wherein an area of the first overlapping region is denoted as S11;
at least a portion of the storage electrode overlaps with the second pixel electrode to form a second overlapping region, wherein an area of the second overlapping region is denoted as S21;
at least a portion of the storage electrode overlaps with the first electrode to form a third overlapping region, wherein an area of the third overlapping region is denoted as S12;
at least a portion of the storage electrode overlaps with the second electrode to form a fourth overlapping region, wherein an area of the fourth overlapping region is denoted as S22; and
a sum of S21 and S22 is approximately equal to a sum of S11 and S12.

8. The liquid crystal display panel according to claim 7, wherein:
at least a portion of the storage electrode overlaps with the first pixel electrode to form a first capacitance;
at least a portion of the storage electrode overlaps with the second pixel electrode to form a second capacitance;
a storage capacitance of the first sub-pixel includes the first capacitance and the first auxiliary capacitance;
a storage capacitance of the second sub-pixel included the second capacitance and the second auxiliary capacitance; and
the storage capacitance of the second sub-pixel is approximately equal to the storage capacitance of the first sub-pixel.

9. The liquid crystal display panel according to claim 6, wherein
the second metal layer further includes the second electrode and a drain of the second thin film transistor;
the array substrate further includes a storage electrode between the pixel electrode layer and the planarizing layer;
the storage electrode includes a plurality of openings, and
a first penetrating hole and a second penetrating hole adjacent to each other is in the same opening.

10. The liquid crystal display panel according to claim 9, wherein the array substrate further includes:
a pixel electrode layer on one side of the base substrate away from the second metal layer and including the first pixel electrode and the second pixel electrode for each pixel; and
a planarizing layer between the pixel electrode layer and the second metal layer;
wherein:
the first pixel electrode is connected to the first electrode through a first penetrating hole across the planarizing layer;

the second pixel electrode is connected to the second electrode through a second penetrating hole across the planarizing layer; and the first penetrating hole and the second penetrating hole is adjacent to each other, and is located on a border between the first sub-pixel and the second sub-pixel.

11. The liquid crystal display panel according to claim 4, wherein the auxiliary electrode receives common voltage signals.

12. The liquid crystal display panel according to claim 11, wherein:

an overlapping area between the second pixel electrode and the storage electrode is larger than an overlapping area between the first pixel electrode and the storage electrode; and the auxiliary electrode receives common voltage signals.

13. The liquid crystal display panel according to claim 6, wherein a plurality of pixels are arranged in an array, including first pixels and second pixels adjacent to each other;

the first pixels and the second pixels are arranged along an extending direction of the data lines;

the first sub-pixel and the second pixel of each pixel are arranged along the extending direction of the data lines;

each scanning line includes a primary scanning line, a first scanning line, and a second scanning line between the first pixels and the second pixels;

the array substrate further includes a primary thin film transistor for each pixel, a source of the primary thin film transistor is connected to the corresponding data line, a first drain of the primary thin film transistor is connected to the source of the first thin film transistor, a second drain of the primary thin film transistor is connected to the source of the second thin film transistor, and a gate of the primary thin film transistor is connected to the primary scanning line;

a gate of the first thin film transistor is connected to the first scanning line, and a gate of the second thin film transistor is connected to the second scanning line; and the first thin film transistor and the second thin film transistor are metal-oxide thin film transistors.

14. The liquid crystal display panel according to claim 13, wherein the first thin film transistor and the second thin film transistor are indium gallium zinc-oxide thin film transistors.

15. The liquid crystal display panel according to claim 5, wherein the array substrate further includes a reflective metal layer on one side of the second metal layer away from the base substrate;

the first pixel electrode and the second pixel electrode is a transparent conducting layer; and the second metal layer is used as a reflective metal layer simultaneously.

16. The liquid crystal display panel according to claim 1, wherein the first pixel electrode and the second pixel electrode are used together as a reflective metal layer simultaneously.

17. The liquid crystal display panel according to claim 1, wherein the second sub-pixel has an area approximately twice of the first sub-pixel; and the second pixel electrode has an area approximately twice of the first pixel electrode.

18. The liquid crystal display panel according to claim 1, further including:

a color filter layer comprising a plurality of color-blockers;

wherein the first sub-pixel and the second sub-pixel in a same pixel correspond to a color-blocker of the plurality of color-blockers with a same color.

19. The liquid crystal display panel according to claim 18, wherein:

a plurality of pixels arranged in an array further includes first color pixels, second color pixels and third color pixels;

the first color pixels, the second color pixels and the third color pixels are arranged along an extending direction of the scanning lines;

the color filter layer includes a first color-blocker, a second color-blocker and a third color-blocker, corresponding to the first color pixels, the second color pixels and the third color pixels, respectively; and a color of the first color-blocker, a color of the second color-blocker and a color of the third color-blocker is red, green and blue respectively.

20. The liquid crystal display panel according to claim 1, further including:

a color film substrate; and a liquid crystal layer, wherein:

the liquid crystal layer is between the array substrate and the color film substrate; and the color film substrate includes a color filter layer and a common electrode.

* * * * *